United States Patent [19]

Oi

[11] Patent Number: 5,574,384
[45] Date of Patent: Nov. 12, 1996

[54] COMBINED BOARD CONSTRUCTION FOR BURN-IN AND BURN-IN EQUIPMENT FOR USE WITH COMBINED BOARD

[75] Inventor: Kenichi Oi, Osaka, Japan

[73] Assignee: Tabai Espec Corp., Osaka, Japan

[21] Appl. No.: 440,589

[22] Filed: May 15, 1995

[30] Foreign Application Priority Data

Jan. 31, 1995 [JP] Japan .................................. 7-037546

[51] Int. Cl.$^6$ ................................................ G01R 31/02
[52] U.S. Cl. ............................................................ 324/760
[58] Field of Search ........................................ 324/754, 755, 324/765, 73.1, 158.1; 439/482; 437/8; 257/40, 48; 165/80.3, 61, 80.2

[56] References Cited

U.S. PATENT DOCUMENTS

| | | | |
|---|---|---|---|
| 4,038,599 | 7/1977 | Bove et al. | 324/754 |
| 5,006,796 | 4/1991 | Burton et al. | 324/760 |
| 5,132,613 | 7/1992 | Papae et al. | 324/754 |
| 5,144,228 | 9/1992 | Soma et al. | 324/754 |

FOREIGN PATENT DOCUMENTS 2-190774  7/1990  Japan .
5-19012   1/1993  Japan .

Primary Examiner—Vinh P. Nguyen
Attorney, Agent, or Firm—Jordan and Hamburg

[57] ABSTRACT

An apparatus for burn-in of semiconductor devices has board assemblies including a burn-in board and a driver board. The burn-in board has sockets on a first surface for accepting the semiconductor devices and first terminals extending from the sockets to protrude from a first back side of the burn-in board. The driver board has a second surface carrying an electronic circuit to drive the semiconductor devices and a second back side with second terminals for connecting the electronic circuit to the first terminals. The driver board has an edge connector with terminals for applying power to the electronic circuit. The burn-in board and the driver board are disposed with the first and second back sides facing such that corresponding ones of the first and second terminal can be brought into and out of contact with each other. The board assemblies are supported in a housing wherein the board assemblies form partitions isolating first and second environmental spaces for burn-in and cooling operation. A flexible seal is provided between the burn-in board and the driver board to permit said first and second terminals to be brought into contact with each other by pneumatic operation.

7 Claims, 7 Drawing Sheets

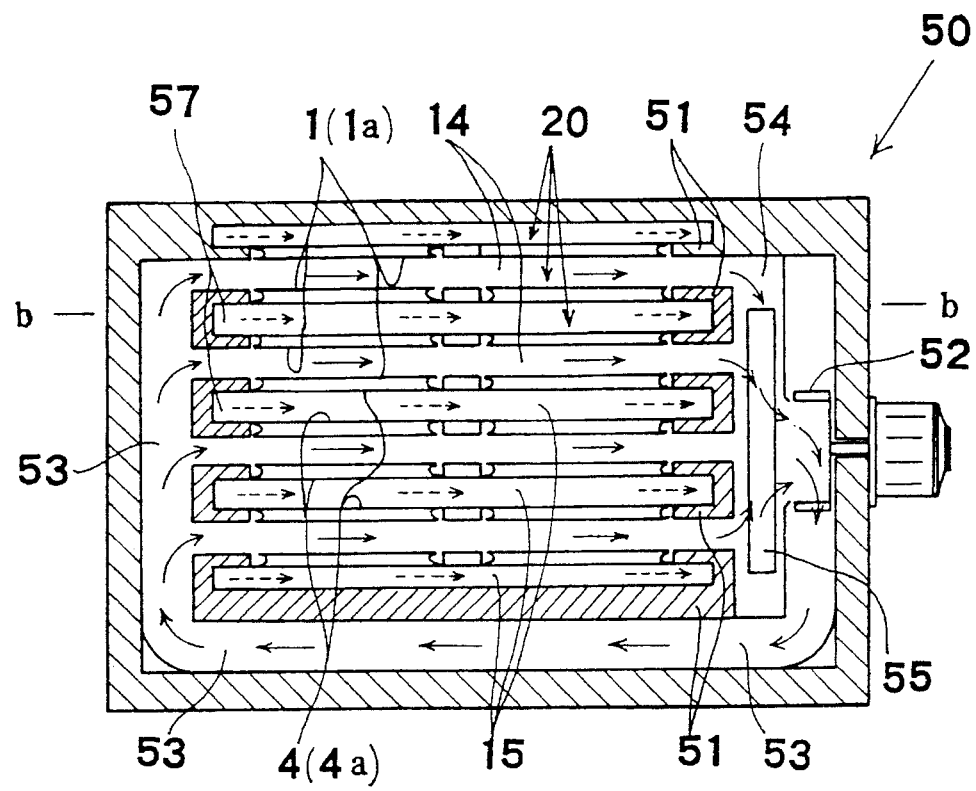
F I G. 3 (a)
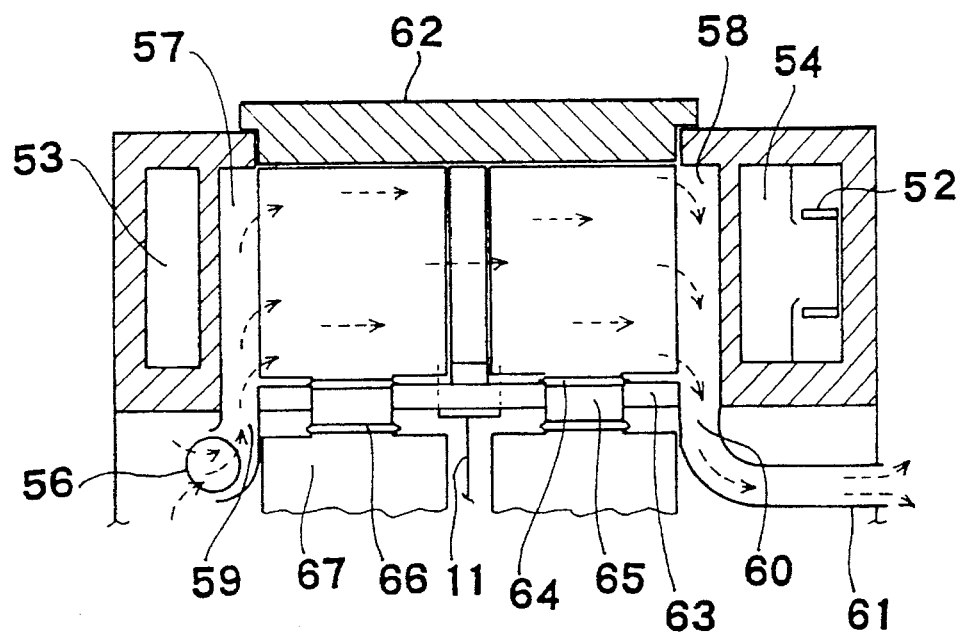
F I G. 3 (b)

PRIOR ART
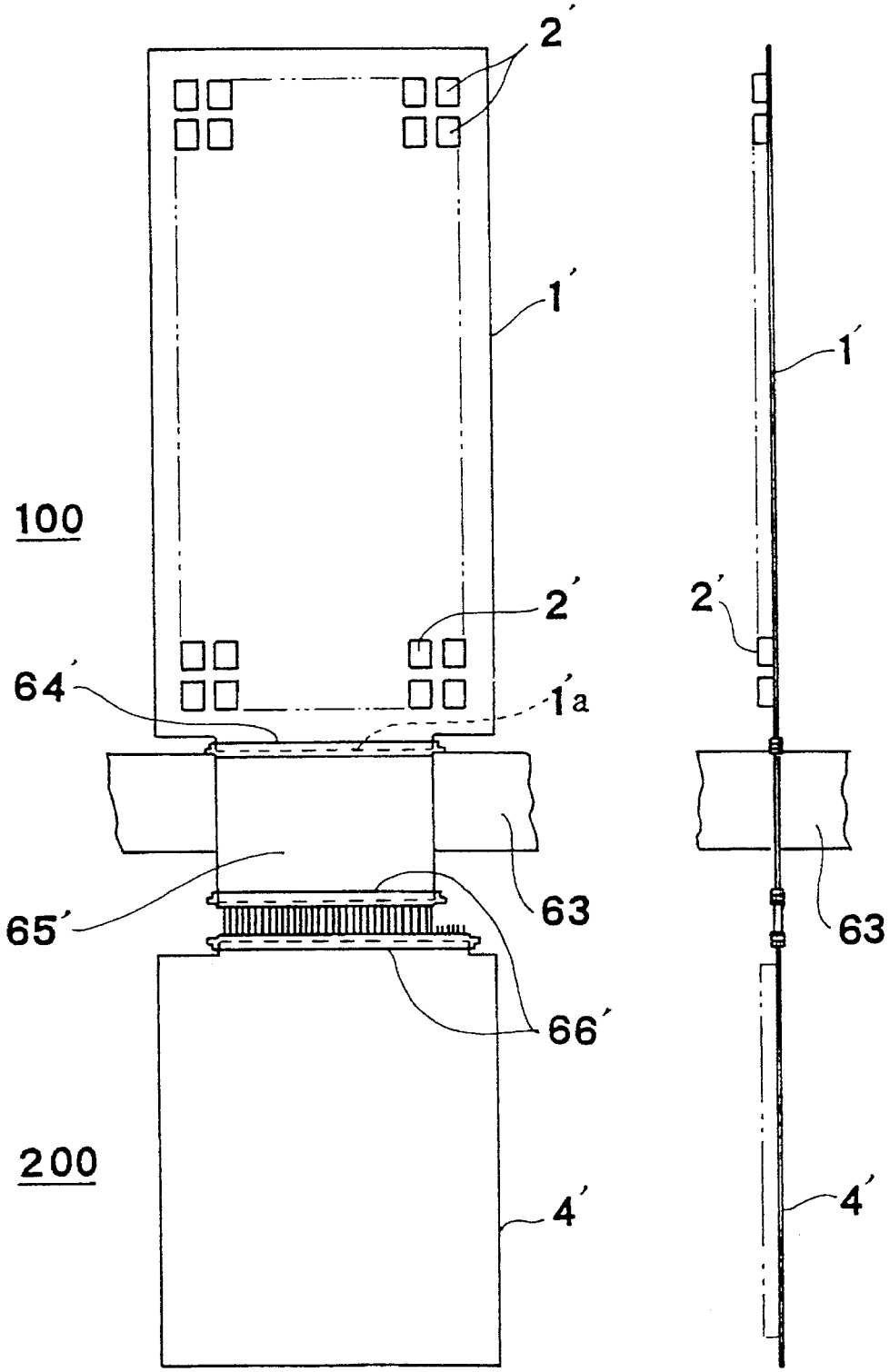
F I G. 11 (a)  F I G. 11 (b)

COMBINED BOARD CONSTRUCTION FOR BURN-IN AND BURN-IN EQUIPMENT FOR USE WITH COMBINED BOARD

BACKGROUND OF THE INVENTION

This invention relates to a combined board construction for burn-in and a burn-in equipment for use with the combined board to carry out burn-in for quality control and elimination of latent defects of semiconductor elements (herein after called "the devices") such as integrated circuit elements etc.

The burn-in is usually carried out in a temperature chamber exposing the devices in a high temperature atmosphere to provide a large stress to them and to reduce time for the burn-in by increasing acceleration factors.

As shown in FIG. 11(a) and 11(b) a burn-in board 1' with large number of I C sockets 2' on which the devices are to be mounted is displaced in a test room 100 in the temperature chamber to expose the devices to the high temperature atmosphere. On the other hand, a driver board 4' which generates signals to operate the devices is displaced outside 200 of the temperature chamber.

The burn-in board 1' and the driver board 4' are connected electrically through an edge 1' provided at the end of the burn-in board, an edge connector 64' installed in multistage or multistage and multi-rows on a surface of a thermally insulated wall 63, a feed through board 65' connected at the opposite end of the edge connector 64' passing through the wall 63, and a relay connector 66'. Thus, electric power and operating signals are supplied to the devices mounted on the I C socket 2' from the driver board 4' through the burn-in board 1'.

As operating speed of the devices is steadily increasing recently, high speed driving signals matching to the operate ink speed of the devices must be applied. In addition, as integration of the devices increases, increased time is required for activating all the cells in the devices, resulting in possible prolonged burn-in time. In the conventional equipment mentioned above, the long series connection of the burn-in board 1' and the driver board 4' requires longer circuit lines and delays the signal transmission. The conventional equipment, therefore, is not suitable for transmission of high speed signals.

Further, as the devices on the burn-in board are located at different distances from the edge, it is inevitable for each device to have a connecting circuit of different length. As a result, for high speed driving signaling, when the device located remotest from the edge connector 64' receives a signal pulse, the device nearest to the edge connector will be applied with next signal pulse, thus causing such problems as the impossibility of activating all the devices on the burn-in board at the same time. In addition, the connecting circuit, as it becomes longer, have caused such hindrance as distorted pulses etc. due to electrostatic capacity and resistance.

The problem and hindrance mentioned above can be solved to a certain degree, if the driver board, the feed-through board and the burn-in board are shortened. However, there is a limitation for this shortening, and the problem of different length of connecting circuit between the edge connector and each device on the burn-in board still remains unsettled.

On the other hand, the burn-in sometimes uses a test burn-in process which observes action of the devices in operation by a driver/test board. In this process, as signals go and return between tile devices and a measuring circuit, it requires more time for signals transmission and causes a larger difference of acting time between the devices.

In addition to the electric power and operating signals, many electrical connections for the measuring circuit are required and there are insufficient terminals at the edge connector. To cope with this, the operating circuit and the measuring circuit have been commonly used in parallel connection to plural devices. This has resulted in a large limitation on the numbers of measuring items and measuring speed, thus decreasing the measuring accuracy.

To solve the problems mentioned above, an equipment which has shortened signal circuit by placing a signal generating board in a temperature chamber has been proposed (Refer to Japanese Patent Laid Open Hei 5 - 19012). This equipment, however, cannot fully solve the above problems since the connecting circuit is not fully shortened. Further, no measures have been taken to eliminate the difference of connecting circuit length in each device.

Another type equipment is proposed in which burn-in and testing can be easily switched over by such a configuration that a burn-in board itself is made of a combination of an IC fitting board and a printed circuit board with edge terminals, where the detachable IC fitting board can be easily connected to a testing board outside a temperature chamber ( Refer to Japanese Patent Laid Open Hei 2 -190774). In this combination, however, though there is no explanation, the printed circuit board must be connected to the driver board which will be placed outside the temperature chamber when carrying out the burn-in. Therefore, this prior art hardly contributes to solve the above problems.

SUMMARY OF THE INVENTION

To solve the above mentioned problems in the prior art, the present invention provides a combined board construction and burn-in equipment for use with the combined board which are capable of transmitting signals to test objects at a super high speed and of connecting a large number of terminals.

To achieve the aforesaid object, the combined board construction for burn-in according to this invention comprises:

a first board having a first surface with a large number of connecting members to electrically connect test objects to be mounted, and a first back face with first terminals electrically connected to the connecting members; and a second board having a second surface with an electronic circuit to generate signals for operating said test objects, and a second back face with second terminals electrically connected to the electronic circuit and a side with a side terminal electrically connected to the electronic circuit for powering the electronic circuit.

The first terminals and the second terminals are provided correlatively in number to the connecting members and are so arranged to contact each other when the first back face and the second back face are brought together In this invention, the test objects to be mounted on the connecting members of the first board are to be connected electrically to respective first terminals. On the other hand, the second board is furnished with on its surface and back face the electronic circuit to generate signals to operate the test objects and second terminals electrically connected to the circuit respectively. The first terminals and the second terminals are so arranged to contact each other when the first back face and/or the second back face are closed. Which allows the connecting members and the electronic circuit to be connected at a very short and equal distance.

The second board is provided with a side terminal which receives electric power from outside and accordingly powers the electronic circuit. Respective test objects which are mounted very close and at the same distance to the electronic circuit can be operated within a short period of time and at the same timing.

The two boards are combined with the first back face and the second back face close to each other such that, the test objects on the connecting members and the electronic circuit isolated by the first board and the second board. With this configuration, the test objects can be exposed to high temperature atmosphere and the electronic circuit, normal temperature atmosphere, for example, in burn-in operation, by which two objects can be achieved; burn-in of the test objects and protection of the electronic circuit from high temperature.

Further, by making the first board and second board integral and separable, each board can be effectively utilized; the first board is independently used for mounting and dismounting a large number of the test objects, while the first board can be used together with the second board for burn-in. From this application, each board may be prepared in required quantity, enhancing usage efficiency of each.

The electric connections between the test objects and the electronic circuit at very close and equal distance bring about many advantages; the electric lines are reduced to one tenth of the prior systems for example, resulting in the short time and same time operation of the test objects. This accordingly eliminates the problems due to location distance of the test objects, and super speed operating signals competing with the activating speed of semiconductor elements (the devices) as the test objects can be applied, meaning that though the devices are highly integrated, all the cells in the devices can be activated within a short period of time and accordingly the burn-in time can be shortened.

Such memory cells as called RDRAM (Rambus DRAM) and SDRAM (Synchronous DRAM), to which conventional type of burn-in equipments cannot respond to the high speed of their operating signals, are burned-in in a short time and convenient manner if this invention is adopted. Further, this invention can apply to any burn-in of the devices operated with super speed which would be developed in future. The extremely short circuit line will reduce electrostatic capacity and resistance and maintain pulse shape fidelity. The first board and the second board, as made separable units from their combination, allow effective utilization of the respective boards.

Another embodiments of the invention of the combined board construction for burn-in is characterized in that the electronic circuit includes a measuring circuit which measures operation states of the test objects.

In this invention, test burn-in system is adopted. In this case, as the electric circuit and the test objects are connected back to back, transmission of signals between them becomes very quick and no time lag occurs among the test objects. In addition, as the connection by means of edge connector between the electronic circuit containing the measuring circuit and the test objects are dispensed with, there is no limitation to the quantity of terminals in the edge connectors which are used for connecting the measuring circuit along with electronic power and operating signals. As a result, numerous measuring items are quickly processed and its measuring accuracy can be enhanced.

Another embodiments of the invention of the combined board construction for burn-in comprises:

sealing member for sealing a space defined by the first board and the second board when in close proximity to each other at back to back position, in a vicinity of circumferences of the first and second boards, having flexibility to such an extent that the first terminals and the second terminals come into contact with each other, and, an opening to be connected to a suction part of evacuation means to evacuate air in the space enclosed by the sealing member.

In this invention, the space enclosed by the sealing member can be made airtight and have negative pressure when a proper suction device is connected to the opening and the evacuation means is operated. With this configuration, the atmospheric pressure operates on the outside of the first board and the second board, to press them together to a position as the first terminals and the second terminals come into contact with each other as the sealing member flexes.

Both the terminals, when negative pressure is applied in this way, can be contacted at suitable force in proportion to the pressure difference with the atmospheric pressure, and any shock or excessive force will never effect on the terminals. In addition, as the pressing force acting on the boards arising from the negative pressure is a uniform load which equally acts on all the surface, a number of terminals on the first board and the second board are subjected to the same and equal pressure. In this case, the boards through thin and having some uneven surface, will not affect on the contact of the terminals, which accordingly will be never damaged, and will make all the terminals contact each other with the same force and a sound manner.

The invention of the burn-in equipment for use with the combined board construction as mentioned above is characterized to comprise:

contacting means being capable of causing the first terminals and the second terminals to contact with each other;

supporting means for supporting the combined board constructions in raw in such a way that the first surfaces and the second surfaces respectively form first spaces and second spaces;

a partition member for isolating the first spaces from the second spaces;

test-oriented means for giving a suitable environment to the first spaces for the test objects to be carried out in burn-in; and circuit-oriented means for giving a suitable environment to the second spaces for the electronic circuit.

In this invention, when the combined board constructions are supported by the supporting means, the connecting members for mounting the test objects will be placed face to face in the first spaces, and the electronic circuits will be placed face to face in the second spaces. For each combined board construction, the first terminals and the second terminals will be contacted each other by the contacting means.

As the contacting means, a sealing and evacuation means produce negative pressure the space between the first board and the second board, and other means to press or fasten the two boards can be utilized. In this case, these means may be made independent of the burn-in equipment and used to combine two boards outside with the merged units being put into the burn-in equipment and supported by the supporting means of the equipment.

Alternatively, the burn-in equipment may be fitted with pressing or fastening means, and each board may be put into the burn-in equipment one by one, and the boards, after supported respectively by supporting means, may be combined by the pressing means etc.

The first spaces and the second spaces are isolated by the partition member and each space is made to have a different environment. The first spaces are given an environment suitable for burn-in of the test objects by the test oriented means, and the second spaces are given an environment suitable for the electronic circuits by the circuit-oriented means, thus protecting tile electronic circuits from high temperature environment while the test objects are exposed to high temperature environment in burn-in test.

In this way, the test objects and the electronic circuits are given the environments suitable for respective purposes, and signal transmission in each combined board is made uniform and quick, resulting in the shortening of burn-in time.

As the test-oriented means, a hot air circulation system which circulates hot air heated by a heater is usually used, but other means for producing a humid environment or special gas environment, etc. may be employed to cope with the type and use of the test objects.

As the circuit-oriented means, a cooling system using outside air for example, is employed to protect the electronic circuits from heating by the adjacent high temperature environment of the test objects, but a cooled air circulating system which circulates air cooled by a cooling means may be employed instead.

The burn-in equipment according to the above invention can be used with the combined board constructions each haying the sealing member and the opening to which the suction part of the evacuating means is connected as the contacting means. In the contacting means of this type, only the sealing member and the opening are required for the combined board construction, and such evacuating means as a vacuum pump unit can be installed outside the burn-in equipment, which accordingly dispenses with a complicated mechanism for contacting terminals in the burn-in equipment. Therefore, the inside space of the burn-in equipment can be effectively utilized.

The evacuation means are of such characteristic as to be easily operated outside, and can be operated only in the burn-in operation when the first terminals and the second terminals must contact each other. Therefore, spring force of the terminals will not weaken with age contributing to a long and excellent contact.

Further, the boards are so sealed with the sealing member that high temperature air for burn-in will never come into the inside. The terminals at the back faces are thus protected from high temperature, increasing durability of the terminals. In addition, heat transfer to the electronic circuit on the second board surface from the back surface will be minimized, thus protecting the electronic circuit from high temperature. In conclusion, this type of contacting means gives two merits at the same time; excellent contact between the terminals and thermal insulation for the electronic circuit.

Another embodiment of the invention of the combined board construction for burn-in provides a second board having second terminals and an electronic circuit on one face, and an inlet and an outlet of fluid for cooling the space enclosed by the sealing member.

In this invention, the cooling fluid can be supplied to and discharged from the inlet and the outlet passing through the space. As this space houses the first and second terminals and the electronic circuit, they can be cooled. With this configuration, the first board surface and the second board surface where no electric circuit is mounted can be exposed to a high temperature environment in burn-in. Accordingly, the quantity of the combined board constructions to be loaded into the burn-in equipment can be increased, with quick and uniform signals achieved while protecting the electronic circuits.

BRIEF DESCRIPTION OF THE DRAWINGS

In the accompanying drawings, there are shown illustrative embodiments of the invention from which these and other of its objectives, novel features and advantages will be readily apparent.

In the drawings:

FIG. 3(a) and 3(b) shows a construction of a temperature chamber: 3(a) and shows a longitudinal section, and 3(b) shows a sectional view taken along line b—b in Fig. (a);

FIG. 11(a) and 11(b) shows connecting state of a burn-in board and a driver board in a prior art: 11(a) shows a plan view, and 11(b), a side view.

DETAILED DESCRIPTION OF THE PREFERRED EMBODIMENT

Figure 1:
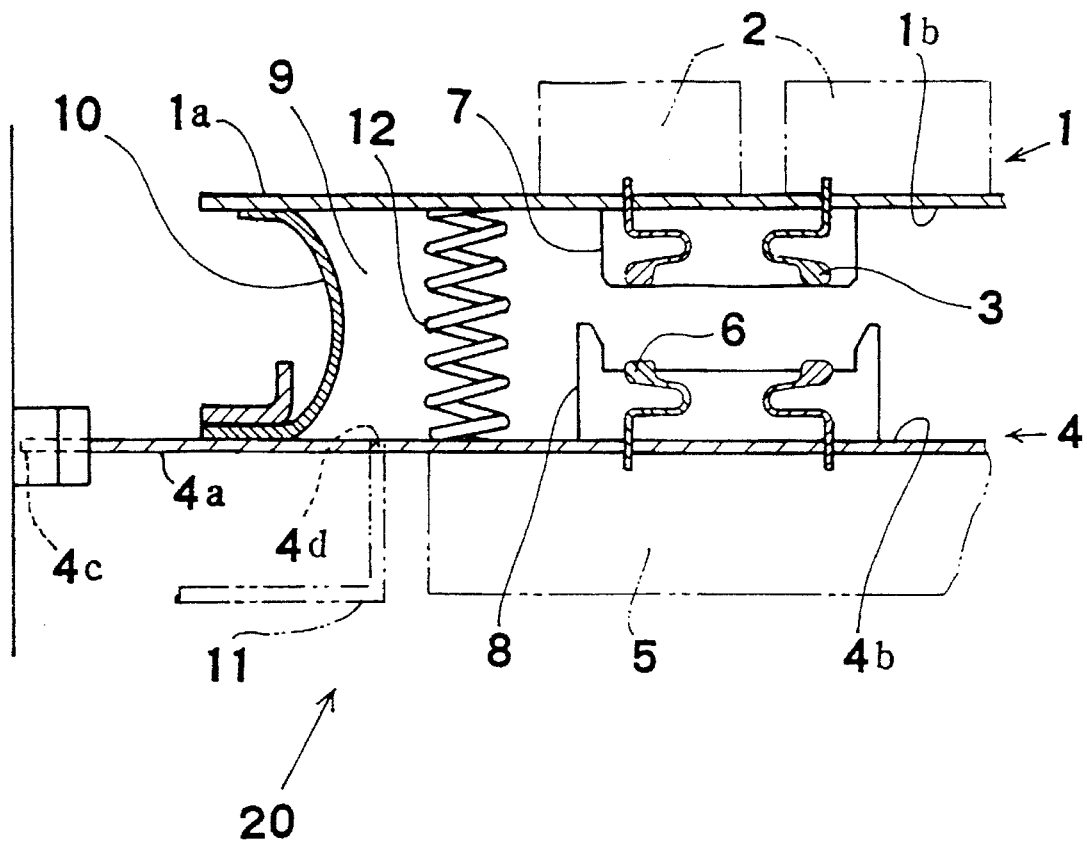
FIG. 1(a) and 1(b) sectional schematic views of terminals on combined boards: 1(a) shows two terminals at an open position, 1(a) and 1(b), a closed position by evacuation.
Figure 1:
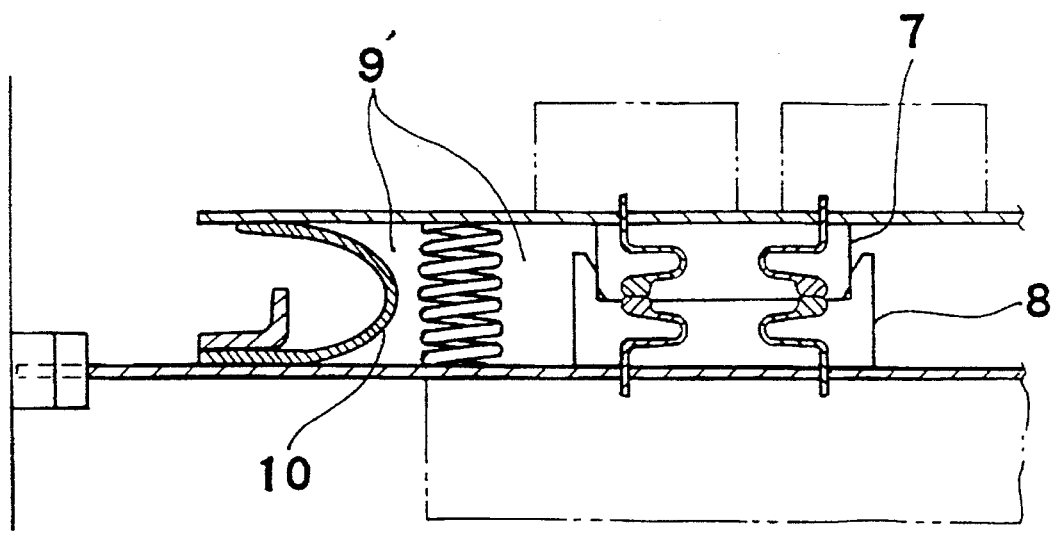

FIG. 1(a) and 1(b) terminals of a combined board construction of embodiment of the present invention.

The combined board construction for burn-in comprises:

a burn-in board 1 as a first board having a first surface 1a with a large number of I C sockets 2 as connecting members to electrically connect semiconductor elements (the devices not shown in the drawing ) as test objects to be mounted, and a first back face 1b with first terminals 3 electrically connected to the I C sockets 2; and a driver/test board 4 as a second board having a second surface 4a with an electronic circuit 5 to generate signals for operating the devices, and a second back face 4b with second terminals 6 electrically connected to the electronic circuit 5 and a side with an edge 4c with side terminal electrically connected to the electronic circuit 5 by printed circuit ( not shown )to power the circuit 5.

The first terminals 3 and the second terminals 6 are provided correlatively in number to the I C sockets 2 and so arranged as to contact each other at the face-to-face closing of the first back face 1b and the second back face 4b as shown in FIG. 1 (b). The first terminals 3 and the second terminals 6 are U-shaped to maintain the contacting force, and are respectively housed into two-piece pressing connectors of male type 7 and female type 8 as integral with the adjacent terminals.

This type of pressing connectors can be made for a large installation having hundreds terminals, but in order to level the circuits length, it is desirable to make one board for some tens of terminals and to put the connectors scattered over all the back faces of the burn-in board and driver/test board. In case of smaller number of terminals, other pressing connection such as contact probe for example may be used.

In this embodiment, a gasket 10 is fitted on the driver/test board 4 as a sealing member which seals a space 9 between the burn-in board 1 and the driver/test board 4 when they are closed back to back, at a closed position to circumferences of the two boards. The driver/test board 4 also has an opening 4d to connect a suction port of an evacuation device to evacuate air in the space 9 enclosed by the gasket 10.

The gasket 10 is made of heat-resisting flexible material such as silicone rubber for example. Atmospheric pressure is applied outside of the burn-in board 1 and the driver/test board 4 when air in the space 9 is sucked out by operating the evacuation device. As a result, the gasket 10 is pressed and deformed as shown in FIG. 1 (b). Tile deformation stops when the male type connector ? comes into contact with the female type connector 8, pressing the first and second terminals 3 and 6 against each other.

Additional springs 12 work to remove the burn-in board from the driver/test board 4 when the evacuating operation stopped at the completion of burn-in. This allows easy exchanging and mounting/dismounting of the burn-in board 1. The additional springs 12 can work as parts of electric connections such as ground circuits for discharging noise and static electricity.

The gasket 10 and the springs 12 are not always fixed on the driver/test board 4 They may be mounted on the driver/ test board 4 when it is installed in the burn-in equipment. Further, the gasket 10 and the springs 12 may be dispensed when some other contacting means between the terminals 3 and 6 besides the evacuation means are used.

The I C sockets 2 and the first terminals 3 are connected electrically by a printed circuit formed on the burn-in board 1. The electronic circuit 5 according to this embodiment not only has an operating signal source to generate signals for operating the devices but also has a measuring circuit part to measure operating states of the devices. Although the electronic circuit 5 is fitted on the second surface 4a of the driver/test board 4 as mentioned above, some parts of it's components which have heat resisting capabilities to some extent may be fitted on the second back face 4b if they can not be arranged on the second surface 4a.

FIG. 2(a) and 2(b) shows detail construction of the suction port.

The suction part 11 is composed of a suction port 11a to be connected to the opening 4d which is provided at close position to the circumference of the driver/test board 4, a junction pipe 11b, a socket 11c fixed to a wall panel 63a on a thermally insulated back wall 63 of a temperature chamber 50 in FIG. 3, and a pipe 11d connected to the socket 11c. The pipe 11d is led from a pressure reducing equipment 13 such as a vacuum pump for example. Such suction part 11 and pressure reducing equipment 13 are component parts of the burn-in equipment.

FIG. 3(a) and 3(b) shows detail construction of the temperature chamber 50 as the burn-in equipment for use with the combined board construction as mentioned above.

The temperature chamber 50 comprises:

supporting means for supporting the combined board construct ions for burn-in 20 in raw in such a way that the first surfaces la and the second surfaces 4a respectively form high temperature air paths 14 as first spaces and normal temperature air paths 15 as second spaces;

isolating constructions 51 as partition members for isolating the air paths 14 and 15;

a high temperature circulating system as a test-oriented device for providing suitable environment to the high temperature air paths 14 for the devices for carried out in burn-in, which includes a circulation fan 52, a circulation duct 53, a heating zone 54 and a heater 55;

a cooling air system as circuit-oriented device for providing suitable environment to the normal temperature air paths 15 for the electronic circuit 5, which includes a cooling fan 56, cooling air inlets 57 and cooling air outlets 58.

High temperature air discharged from the circulating fan 52 separately flows into each high temperature air path 14 arranged in a multi-stage configuration after passing through the circulating duct 53 which has a bottom part and a vertical manifold part. After passing through the air paths 15, the air is drawn into the circulation fan 52 through the heating zone 54 and the heater 55 where it is heated up to high temperature for next circulation.

The cooling fan 56 which takes in outside air and discharges it is arranged outside of the back wall 63 of the temperature chamber 50. The air is, as shown by arrows with dotted lines in the drawing, distributed at an inlet manifold 59 to the cooling air inlets 57 which are arranged in multi-stages in a vertical direction, supplied to the normal temperature air paths 15, gathered at an outlet manifold 60 from each cooling air outlet 58, and exhausted to outside from an exhaust pipe 61.

Now, if black out occurs during burn-in and operation of the temperature chamber 50 stops, cooling effect of the normal temperature air paths 15 will be lost by stoppage of the cooling fan 56, which causes possible break down of the electronic circuit etc. on the driver/test board 4 due to high temperature. Therefore, it is desirable to use a direct current motor for the cooling fan 56 and to make possible to change over the driving power to direct current source of a storage battery etc., in order to keep the cooling effect.

As the combined board constructions can be mounted in multi-stages and multi-rows according to this temperature chamber, a number of combined board constructions can be effectively accommodated in the chamber. Further, the burn-in of the devices is carried out in the high temperature air paths 14, while the electronic circuits are cooled in the normal temperature air paths, whereby, if heat is generated from the electronic parts of the electronic circuit or transferred from the high temperature zone, it will be removed and normal temperature is maintained, resulting in safe and stabilized operation of the circuits.

Figure 4:
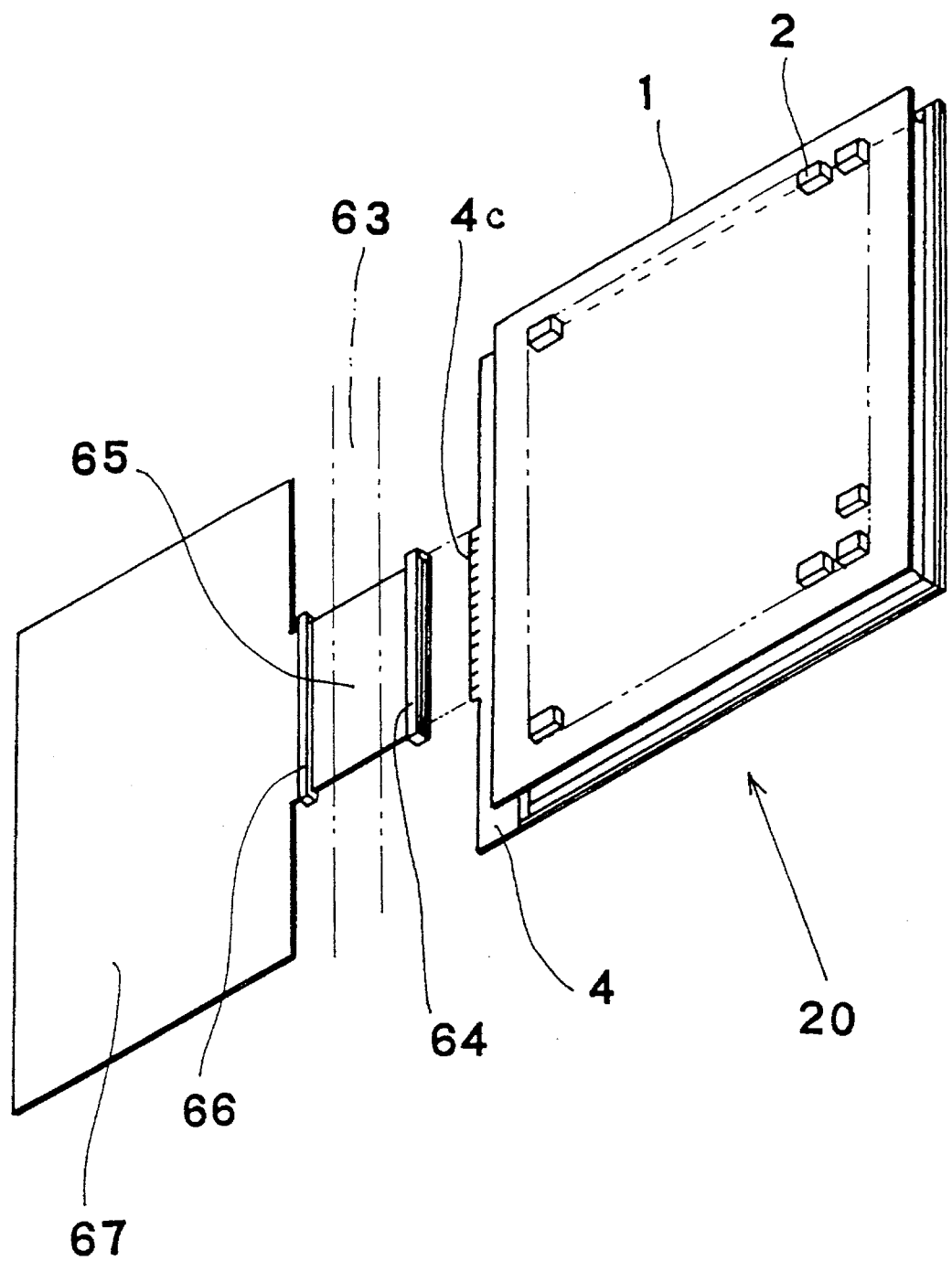
FIG. 4 is a schematic view showing a construction of combined board and a control board.

As shown in FIG. 3 (b) and FIG. 4, in the temperature chamber 50, a door 62 is fitted at the front, and an edge connector 64, a feed through board 65 and a relay connector 66 to which a control board 67 is connected are displaced at the back passing through the thermally insulated wall 63. The suction part 11 led from outside of the temperature chamber 50 and connected to the combined board construction 20 at the back of the chamber. The suction port 11 and the pressure reducing equipment 13 in FIG. 2 which is displaced outside of the chamber are the examples of contacting devices for displacing the terminals 3 and 6 to contact each other.

The control board 67 is composed of an electronic circuit which carries out such functions as voltage control of the devices, generation of operating mode signals, temporal memory of measured data, etc. to control states of the burn-in. Therefore, power and the operating mode signals are given to the driver/test board 4 by the control board 67, while the measured data returns to the control board 67 from the driver/test board 4.

Figure 5:
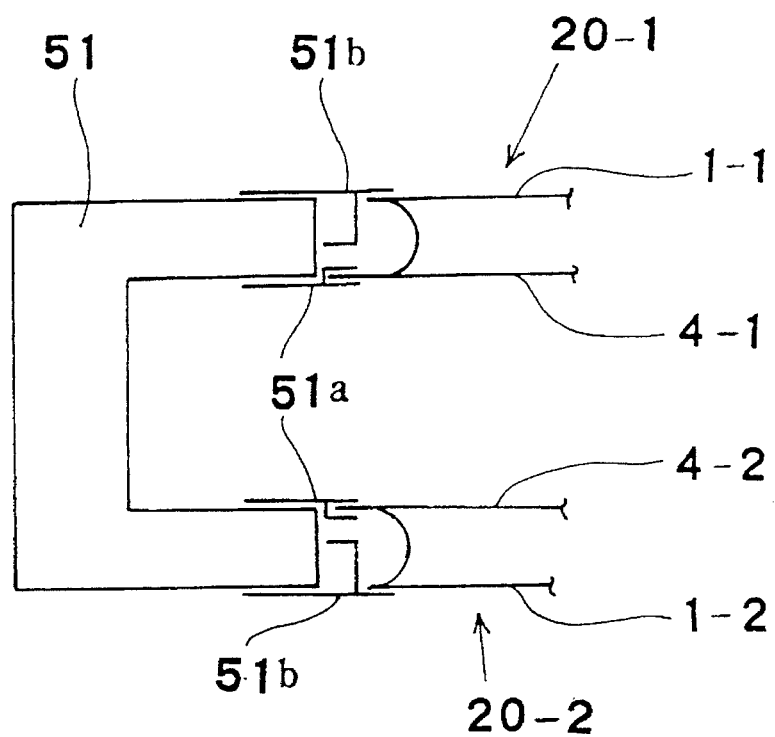
FIG. 5 is a schematic showing an example of supporting members for the combined boards in the temperature chamber.

FIG. 5 shows a support and guide mechanism as an example of a support structure for the combined board construction 20. The combined board construct ions 20-1, 20-2 are supported by upper and lower end portions of the isolating construction 51; the driver/test board 4-1, 4-2 are supported and fixed in their positions by channels of frames 51a fitted at the end portions of the isolating construction 51 to be air tight. The burn-in board 1-1,1-2 is guided and positioned by guide rails 51b at their upper surfaces and end faces.

The combined board construction for burn-in and the burn-in equipment for use with the combined board as mentioned above are operated and work as described hereinafter.

At first,the driver/test boards 4 are loaded into the temperature chamber 50; the driver/test boards 4 are inserted into the channels of the frames 51a with their surfaces which have the electronic circuits 5 facing the high temperature air paths 14. The edges 4c at the front and the junction pipes 11b are inserted into the edge connectors 64 and the suction ports 11a respectively.

The arrangement provides a complete isolating effect of air because the driver/test boards 4 become isolation walls between the high temperature air paths 14 and the normal temperature air paths 15.

Secondly, the burn-in boards 1 are loaded into the temperature chamber 50; the burn-in boards 1 are inserted along with the guide rails 51b with their surfaces on which the devices are mounted facing the high temperature air paths 14, and they are softly touched with the gaskets 10 fitted on the back faces of the driver/test board 4.

Then, the pressure reducing equipment 13 is operated to reduce the pressure the spaces 9. With this operation, the burn-in boards 1 are pressed down and come close to the driver/test boards 4 by atmospheric pressure effect on the boards, whereby male type connectors 7 are fitted in the female type connectors 8, and the first terminals 3 come in contact with the second terminals 6, establishing electric connections between them.

Thermal insulation effects are enhanced by the arrangement because many isolated spaces 9' are produced by the contact between the connectors 7 and 8 as shown in Fig. 17688 (b) and air density is decreased by pressure reducing.

After completion of loading and pressure reducing of all tile combined board constructions 20, the door 62 is closed and the burn-in is carried out as follows; the heater 55 is switched on after starting the circulation fan 52 and the cooling fan 56.

By these operations, the devices mounted on the I C sockets 2 are exposed in high temperature environment. At the same time, the electronic circuits are cooled by outside air passing through the normal temperature air paths 15. In this case, heat transmission is largely reduced by the thermal insulation effects of isolated spaces produced in the combined board constructions as aforesaid. Temperature rise of the first and second terminals 3 and 6 in the isolated spaces are also repressed by cooling effects of the normal temperature air paths 15.

The electric power and the operating mode signals for the devices are supplied from the control board 67 to the driver/test board 4 through the edge connector 66, 64 and the feed through board 65, whereby the operating signals corresponding to the operating modes are given to each of a large number of the devices by the electronic circuit furnished on the driver/test board 4. In this case, as the electronic circuit and the devices are electrically connected at very short and equal distance by the first terminals 3 and the second terminals 6 which are facing each other, the operating signals are provided at almost the same timing to each device. Accordingly, transmission of super high speed operating signals can be applied. The test burn-in is carried out in the same manner as the above, wherein signals are transmitted within a short period of time and at the same timing between the electronic circuit and the devices.

After completion of the burn-in, the pressure in the spaces 9' is recovered to atmospheric pressure by stopping the operation of the pressure reducing equipment. The connection between the connector 7 and 8 is disengaged by restoring force of the gaskets 10 and the additional springs 12, detaching the terminals 3 from the terminals 6. The burn-in boards 1 and the driver/test boards 4 can be handled separately, which makes the operation easier and brings effective utilization of both boards.

Figure 6:
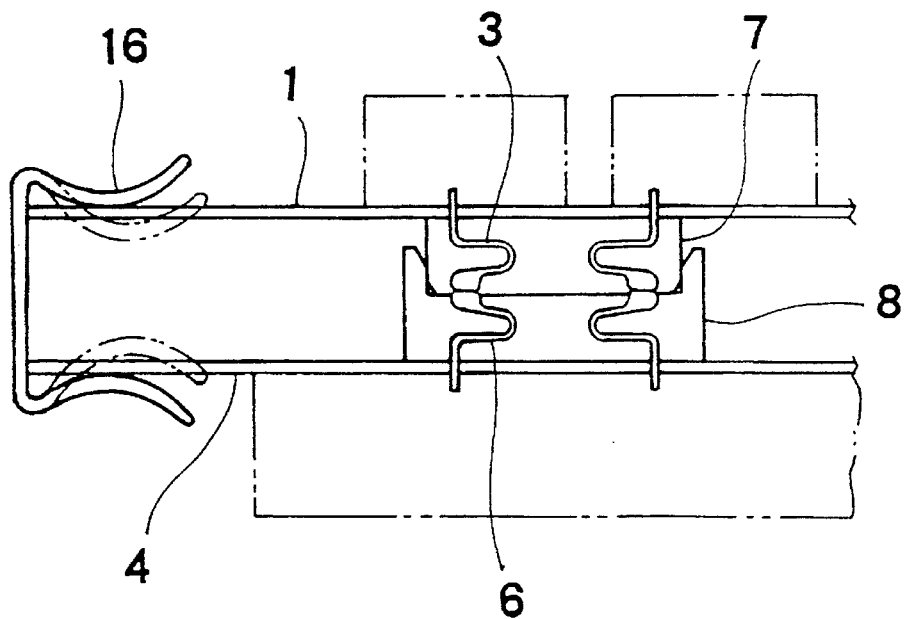
FIG. 6 is a schematic showing an example of a method to press a burn-in boards and a driver/test board against each other.

FIG. 6 shows the combined board construction of another embodiment.

Figure 2:
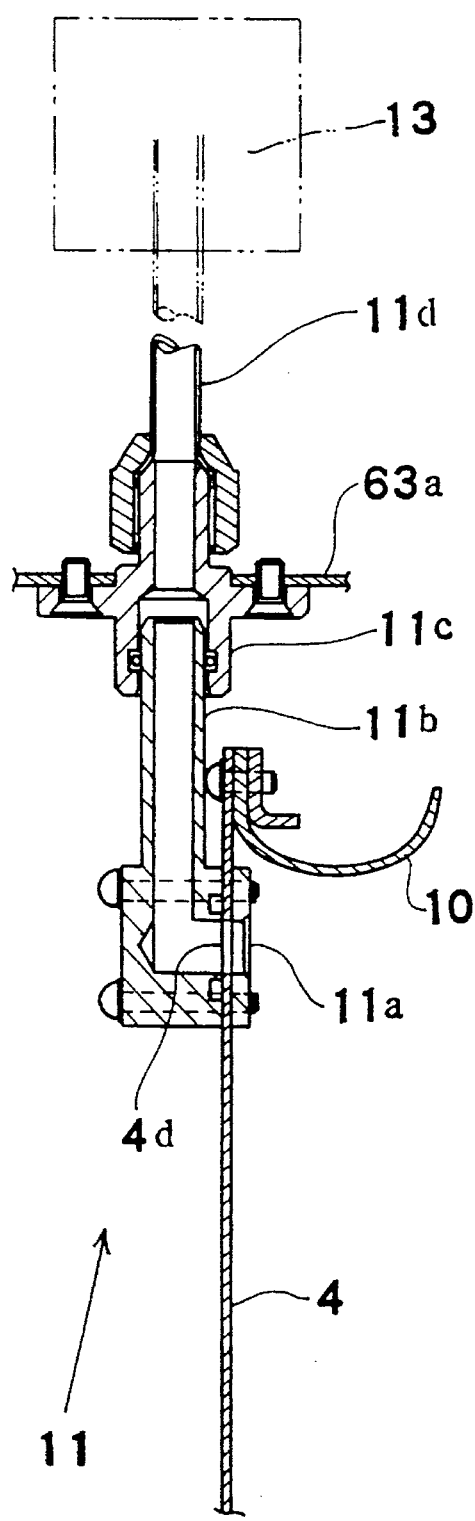
FIG. 2(a) and 2(b) show a construction of suction port for the combined boards: 2(a) shows a sectional view, and 2(b), a plan view.
Figure 2:
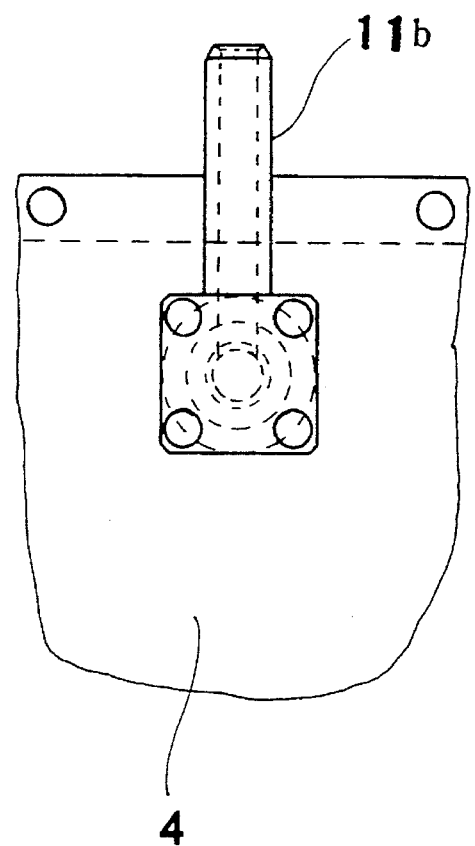

A method to combine the burn-in board 1 and the driver/test board 4 using a clamp is adopted in this embodiment for a mechanism to cause the first terminals 3 and the second terminals 6 to contact with each other, instead of the combination of the gasket and the pressure reducing equipment as shown in FIG. 1 and 2. In the drawing, a clamp of the plate spring type 16 is inserted from the end of the boards 1 and 4. However, any other type clamp may tie used.

Both boards 1, 4 must have rigidity to some extent to use this method. This method is effective when the devices to be mounted are fewer in number, As the burn-in board 1 and the driver/test board 4 can be combined beforehand by this method, the work of loading and unloading the boards in and from the temperature chamber 50 becomes easy.

Figure 7:
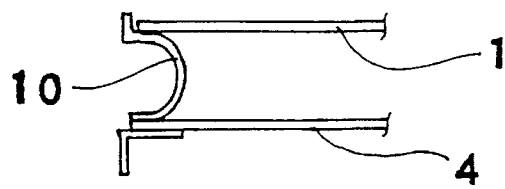
FIG. 7 is a schematic showing a sealing member which is utilized as a guide for inserting the burn-in board.

Such method may be adopted as pressing down the burn-in board 1 toward the driver/test board 4 in the temperature chamber after loading them individually into the temperature chamber, by providing a suitable pressing mechanism in the temperature chamber without using clamps. In this case, the sealing member 10 can also be used as a guide when loading the burn-in board 1 as shown in FIG. 7. The driver/test board 4 may be fixed in the temperature chamber in this mechanism.

Figure 8:
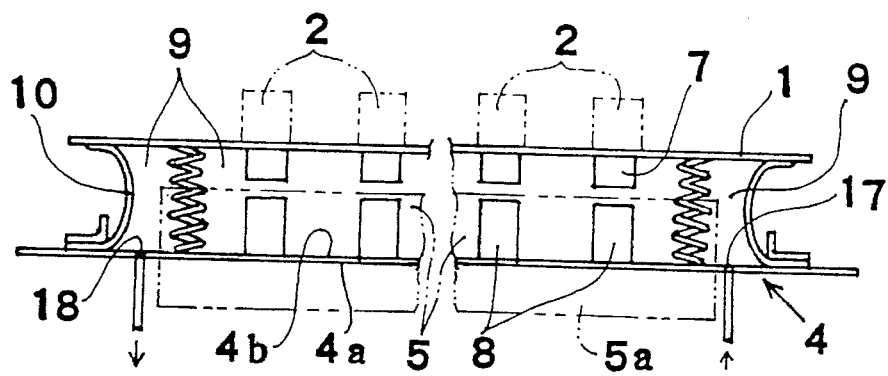
FIG. 8 is a schematic view showing another example of combined boards.

FIG. 8 shows a combined board construction of another embodiment.

The combined board construction of this embodiment differs from that of FIG. 1 in such respect that the driver/test board 4 has the electronic circuit on back face 4b as one face and an inlet 17 and an outlet 18 of fluid for cooling the space 9 enclosed by the gasket 10 as the sealing member. Now, some electric parts of heat-resisting type 5a such as fuses, resistances, etc. are displaced on the surface 4a when all parts constructing the electronic circuit can not be fitted on the back face 4b.

Figure 9:
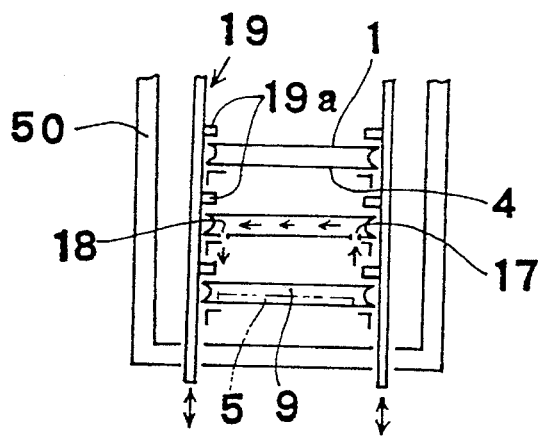
FIG. 9 shows another example of a method to press the burn-in board to the driver/test board.

FIG. 9 shows a state of the combined board constructions loaded in the temperature chamber 50. In this arrangement, the driver/test board 4 may be fixed. A rod assembly 19 which is a component of a pressing mechanism for pressing the burn-in boards 1 to the driver/test boards 4 is fitted with pressing members 19a arranged in the same pitch as the loaded boards in a multi-stage arrangement. The rod assembly 13 operated by mechanical power or manpower.

In this arrangement, spaces between the combined board constructions become high temperature atmosphere suitable for burn-in. This means the normal temperature air paths 15 in FIG. 3 are eliminated. Therefore, cooling fluid such as outside air or cooling liquid is supplied in the space 9 through the inlet 17 as shown by arrows by supply system (not shown) of cooling medium including a fan or a pump etc., and discharged from the outlet 18, cooling the electronic circuit and the connecting terminals. By using this type of combined board constructions,the number of them to be loaded in the temperature chamber can be increased.

Figure 10:
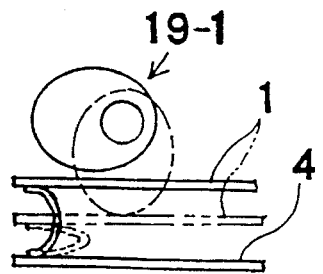
FIG. 10 (a) and FIG. 10 (b) are schematic views showing other two examples of methods to press the burn-in board to the driver/test board.
Figure 10:
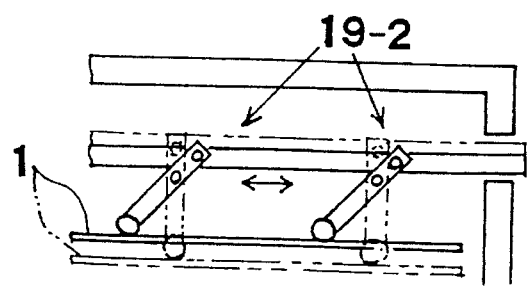

As shown in FIG. 10(a) and 10(b) an eccentric cam mechanism 19-1 or a link mechanism 19-2 can also be used as another type of pressing device It will be obvious to those skilled in the art that various changes may be made in the invent ion without departing from the spirit and scope thereof and therefore the invention is not limited by that which is shown in the drawings and described in the specification but only as indicated in the appended claim.

What is claimed is:

1. A combined board construction for conducting burn-in operations on devices under test, comprising:

a first board having a first surface with electrical connecting members for accepting the devices, and a first back side with first terminals electrically connected to respective electrical contacts of said electrical connecting members;

a second board having a second surface with an electronic circuit for generating signals to operate the devices, a second back side with second terminals electrically connected to said electronic circuit, and a side with side terminals electrically connected to said electronic circuit for powering said electronic circuit;

a sealing member for sealing a perimeter of a space defined between said first back side and said second back side of said first and second boards, respectively when said first and second boards are adjacent one another at a first position with said first and second electrical terminals apart from each other, said sealing member having sufficient flexibility to allow said first and second boards to converge to a second position whereat said first an ond terminals contact each other in response to a pressure differential between said space and an area outside said space; and said first terminals and said second terminals being disposed in correspondence with each other to effect electrical contact between corresponding ones of said first and second terminals when said first back side and said second back side are disposed proximate each other.

2. A combined board construction according to claim 1, wherein said electronic circuit includes a measuring circuit to measure operation states of the devices.

3. A combined board construction for burn-in operations according to claim 1 and further functioning in conjunction with a vacuum producing apparatus, the combined board construction further comprising at least one of said first and second boards defining an opening to be connected to a suction port of said vacuum producing apparatus to evacuate air from said space enclosed by said sealing member.

4. A burn-in apparatus for conducting burn-in operations on devices under test, comprising:

a plurality of combined board constructions each comprising:

a first board having a first surface with electrical connecting members for accepting the devices, and a first back side with first terminals electrically connected to respective electrical contacts of said electrical connecting members;

a second board having a second surface with an electronic circuit for generating signals to operate the devices, a second back side with second terminals electrically connected to said electronic circuit, and a side with side terminals electrically connected to said electronic circuit for powering said electronic circuit;

said first terminals and said second terminals being disposed in correspondence with each other to effect electrical contact between corresponding ones of said first and second terminals when said first back side and said second back side are disposed proximate each other; and contacting means for displacing said first terminals and said second terminals between a first position apart from each other and a second position in contact with each other;

supporting means for supporting and housing said combined board constructions;

said first surfaces and said second surfaces respectively defining in conjunction with said supporting means a first environmental space and a second environmental space wherein said combined board construction isolates said first environmental space from said second environmental space;

first environment control means for producing a burn-in environment in said first environmental space for burn-in of said devices;and second environment control means for generating a normal environment in said second environmental space for said electronic circuit.

5. A burn-in apparatus according to claim 4, wherein the combined board construction further comprises a sealing member for sealing a perimeter of a space defined between said first back side and said second back side of said first and second boards respectively, when said first and second boards are adjacent one another at a first position with said first and second electrical terminals apart from each other, said sealing member having sufficient flexibility to allow said first and second boards to converge to a second position whereat said first and second terminals contact each other in response to a pressure differential between said space and an area outside said space.

6. The apparatus according to claim 5 and further functioning in conjunction with a vacuum producing apparatus, wherein at least one of said first and second boards defines an opening to be connected to a suction port of said vacuum producing apparatus to evacuate air from said space enclosed by said sealing member.

7. A burn-in board assembly for burning-in semiconductor devices, comprising:

a first board having a first surface with electrical connecting members for accepting the devices, and a first back side with first terminals electrically connected to respective electrical contacts of said electrical connecting members;

a second board having a second surface with an electronic circuit for generating signals to operate the devices, a second back side with second terminals electrically connected to said electronic circuit, and a side with side terminals electrically connected to said electronic circuit for powering said electronic circuit;

a sealing member for sealing a perimeter of a space defined between said first back side and said second back side of said first and second boards, respectively, when said first and second boards are adjacent one another at a first position with said first and second electrical terminals apart from each other, said sealing member having sufficient flexibility to allow said first and second boards to converge to a second position whereat said first and second terminals contact each other in response to a pressure differential between said space and an area outside said space; and an inlet and an outlet for cooling fluid open to said space sealed by said sealing member; and said first terminals and said second terminals being disposed in correspondence with each other to effect electrical contact between corresponding ones of said first and second terminals when said first back side and said second back side are disposed proximate each other.

\* \* \* \* \*